United States Patent
Bedeschi

(10) Patent No.: US 9,728,251 B2
(45) Date of Patent: Aug. 8, 2017

(54) RESISTANCE VARIABLE MEMORY SENSING USING PROGRAMMING SIGNALS

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 175 days.

(21) Appl. No.: 13/869,571

(22) Filed: Apr. 24, 2013

(65) Prior Publication Data

US 2014/0321192 A1   Oct. 30, 2014

(51) Int. Cl.
*G11C 13/00* (2006.01)

(52) U.S. Cl.
CPC ........ *G11C 13/004* (2013.01); *G11C 13/0033* (2013.01); *G11C 2013/0042* (2013.01); *G11C 2013/0047* (2013.01); *G11C 2013/0076* (2013.01)

(58) Field of Classification Search
CPC ... G11C 5/14; G11C 11/1673; G11C 13/0023; G11C 13/0004; G11C 13/0033; G11C 13/004; G11C 13/0061; G11C 7/14; G11C 11/5678; G11C 7/067; G11C 7/08
USPC ... 365/148, 149, 145, 157, 158, 175, 189.07
See application file for complete search history.

(56) References Cited

U.S. PATENT DOCUMENTS

| | | | |
|---|---|---|---|
| 6,118,731 A * | 9/2000 | Huang et al. | 365/233.14 |
| 7,136,300 B2 | 11/2006 | Tran et al. | |
| 7,436,698 B2 | 10/2008 | Lin et al. | |
| 8,238,145 B2 | 8/2012 | Abedifard | |
| 8,320,169 B2 | 11/2012 | Zhu et al. | |
| 8,559,256 B2 * | 10/2013 | Kim | 365/204 |
| 9,001,556 B2 * | 4/2015 | Kobayashi et al. | 365/148 |
| 2008/0094876 A1 * | 4/2008 | Siau et al. | 365/148 |
| 2009/0237978 A1 * | 9/2009 | Lee et al. | 365/148 |
| 2010/0321987 A1 * | 12/2010 | Lung et al. | 365/163 |
| 2012/0033512 A1 * | 2/2012 | Takase | 365/191 |
| 2012/0106239 A1 | 5/2012 | Xi et al. | |
| 2012/0287730 A1 * | 11/2012 | Kim | 365/189.06 |
| 2013/0051114 A1 * | 2/2013 | Kim | G11C 11/1673 365/145 |
| 2013/0163320 A1 * | 6/2013 | Lam et al. | 365/163 |
| 2014/0036571 A1 * | 2/2014 | Kobayashi et al. | 365/148 |
| 2014/0104933 A1 * | 4/2014 | Yamahira | G11C 7/04 365/148 |

OTHER PUBLICATIONS

Bedeschi, et al., "Resistance Variable Memory Sensing," Filed Apr. 24, 2013, (30 pgs.).

* cited by examiner

*Primary Examiner* — Allison P Bernstein
*Assistant Examiner* — Jerome Leboeuf
(74) *Attorney, Agent, or Firm* — Brooks, Cameron & Huebsch, PLLC

(57) ABSTRACT

Apparatuses and methods for sensing a resistance variable memory cell include circuitry to apply a programming signal to a memory cell in the array, the programming signal associated with programming resistance variable memory cells to a particular data state, and detect a change in resistance of the memory cell to determine if a data state of the memory cell changes from an initial data state to a different data state during application of the programming signal.

13 Claims, 6 Drawing Sheets

RESISTANCE VARIABLE MEMORY SENSING USING PROGRAMMING SIGNALS

RELATED APPLICATIONS

The present application is related to U.S. patent application Ser. No. 13/869,512, filed on Apr. 24, 2013, entitled "Resistance Variable Memory Sensing,".

TECHNICAL FIELD

The present disclosure relates generally to apparatuses, such as semiconductor memory devices, systems, and controllers, and related methods, and more particularly, to sensing resistance variable memory cells.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), flash memory, and resistance variable memory, among others. Types of resistance variable memory include programmable conductor memory, phase change random access memory (PCRAM), resistive random access memory (RRAM), magnetoresistive random access memory (MRAM; also referred to as magnetic random access memory), conductive-bridging random access memory (CBRAM), and spin torque transfer random access memory (STT RAM), among others.

Non-volatile memory may be used in, for example, personal computers, portable memory sticks, solid state drives (SSDs), personal digital assistants (PDAs), digital cameras, cellular telephones, portable music players (e.g., MP3 players) and movie players, among other electronic devices. Data, such as program code, user data, and/or system data, such as a basic input/output system (BIOS), are typically stored in non-volatile memory devices.

Resistance variable memory, such as RRAM or STT RAM, includes resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying a programming signal to the resistance variable memory cells. Programming signals can include applying sources of an electrical field or energy, such as positive or negative electrical pulses (e.g., positive or negative voltage or current pulses) to the cells (e.g., to the memory element of the cells) for a particular duration.

A resistance variable memory cell can be programmed to one of a number of data states. For example, a single level cell (SLC) may be programmed to one of two data states, a low resistance state that corresponds to a parallel state (e.g., logic 0), or a high resistance state that corresponds to an anti-parallel state (e.g., logic 1). The data state of the memory cell can depend on whether the cell is programmed to a resistance above or below a particular level. As an additional example, various resistance variable memory cells can be programmed to one of multiple different data states corresponding to different resistance levels. Such cells may be referred to as multi state cells, multi-digit cells, and/or multilevel cells (MLCs), and can represent multiple binary digits of data (e.g., 10, 01, 00, 11, 111, 101, 100, 1010, 1111, 0101, 0001, etc.).

In some instances, a sensing operation used to determine the data state of a resistance variable memory cell can incorrectly determine the data state of the resistance variable memory cell. For example, a current associated with the memory cell during a sensing operation may or may not correspond to a data state to which the memory cell was programmed, thus resulting in sensing an incorrect data state for the memory cell.

DETAILED DESCRIPTION

Figure 1:
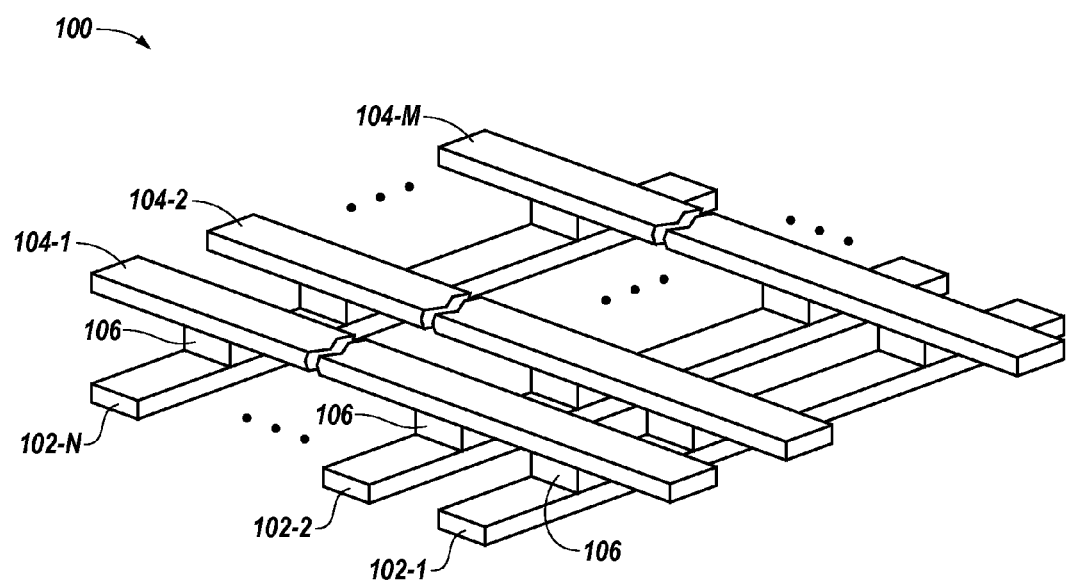
FIG. 1 is a block diagram of a portion of an array of resistance variable memory cells according to a number of embodiments of the present disclosure.

The present disclosure includes apparatuses and methods for sensing a resistance variable memory cell. A number of embodiments include circuitry to apply a programming signal to a memory cell in the array, the programming signal associated with programming resistance variable memory cells to a particular data state, and detect a change in resistance of the memory cell to determine if a data state of the memory cell changes from an initial data state to a different data state during application of the programming signal.

Embodiments described herein can, for example, reduce sensing (e.g., reading) errors and/or increase the speed of a sensing operation as compared to previous approaches. For example, sensing operations in previous approaches can result in sensing errors due to memory cells having a resistance associated with a data state other than the data state associated with the programming signal that was used to program the memory cell. Also, to avoid sensing errors due to memory cells having a resistance associated with a data state other than the data state associated with the programming signal that was used to program the memory cell, previous memory cell sensing approaches can include a number of steps to determine the data state of a memory cell that can be time consuming. For example, previous approaches can include sensing the data state of the memory cell, programming the memory cell to a known data state, and finally sensing the data state of the memory cell again to determine the initial data state of the memory cell. Embodiments of the present disclosure can sense memory cells with increased speed and with fewer errors than previous approaches by applying a programming signal to the memory cell and determining if a change in resistance of the memory cell occurs.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more of such things. For example, a number of memory devices can refer to one or more memory devices. As used herein, the designators "N" and "M", particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 250 may reference element "50" in FIG. 2, and a similar element may be referenced as 450 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a block diagram of a portion of an array 100 of resistance variable memory cells 106 according to a number of embodiments of the present disclosure. In the example illustrated in FIG. 1, array 100 is a cross-point array having resistance variable memory cells 106 located at the intersections of a first number of conductive lines 102-1, 102-2, . . . , 102-N (e.g., access lines, which may be referred to herein as word lines), and a second number of conductive lines 104-1, 104-2, . . . , 104-M (e.g., data/sense lines, which may be referred to herein as bit lines). As illustrated in FIG. 1, word lines 102-1, 102-2, . . . , 102-N are substantially parallel to each other and are substantially orthogonal to bit lines 104-1, 104-2, . . . , 104-M, which are substantially parallel to each other; however, embodiments are not so limited. In the embodiment illustrated in FIG. 1, resistance variable memory cells 106 can function in a two-terminal architecture (e.g., with a particular word line 102-1, 102-2, . . . , 102-N and bit line 104-1, 104-2, . . . , 104-M serving as a bottom and top electrode for the cell 106).

Each resistance variable memory cell 106 can include a storage element (e.g., a resistance variable memory element) coupled (e.g., in series) to a select device (e.g., an access device). The access device can be, for example, a diode or a transistor (e.g., a field effect transistor (FET) or bipolar junction transistor (BJT)), among others. The storage element can include a programmable portion that may have a variable resistance, for example. The memory cell 106 can be a spin torque transfer random access memory (STT RAM) cell and include magnetic tunnel junction, for example. For instance, the storage element can include one or more resistance variable materials (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the storage element of resistance variable memory cells 106 can include various materials employing trapped charges to modify or alter conductivity, chalcogenides formed of various doped or undoped materials, binary metal oxide materials, colossal magnetoresistive materials, and/or various polymer based resistance variable variable materials, among others. Embodiments are not limited to a particular resistance variable material or materials. As such, resistance variable memory cells 106 can be single level and/or multilevel resistive random access memory (RRAM) cells, spin torque transfer random access memory (STT RAM) cells, programmable conductor memory cells, phase change random access memory (PCRAM) cells, magnetoresistive random access memory cells, and/or conductive-bridging random access memory (CBRAM) cells, among various other types of resistance variable memory cells.

In operation, resistance variable memory cells 106 of array 100 can be programmed via programming signals (e.g., write voltage and/or current pulses) applied to the cells (e.g., the storage element of the cells) via selected word lines 102-0, 102-1, . . . , 102-N and bit lines 104-0, 104-1, . . . , 104-M. The magnitude (e.g., amplitude), duration (e.g., width), and/or number of programming pulses, for example, applied to resistance variable memory cells 106 can be adjusted (e.g., varied) in order to program the cells to one of a number of different resistance levels corresponding to particular data states.

In a number of embodiments, a single level resistance variable memory cell may be programmed to one of two data states (e.g., logic 1 or 0). The memory cell may be programmed with a first programming signal, which will place the cell in a low resistance data state (e.g., logic 0) or the memory cell may be programmed with a second programming signal, which will place the cell in a relatively higher resistance data state (e.g., logic 1). In a number of embodiments, the difference in resistance between the low data resistance state and the high resistance data state of a memory cell can be referred to as the reading window. For example, a memory cell in the high resistance data state can have a resistance that is 10 times more that the resistance of the memory cell in the low resistance data state, therefore the reading window for the memory cell can be 10 times the low resistance level. Embodiments in the present disclosure are not limited to a particular reading window and the reading window can include a number of differences in resistance between a high resistance data state and a low resistance data state.

A sensing (e.g., read and/or program verify) operation can be used to determine the data state of a resistance variable memory cell 106 (e.g., the resistance state of the storage element of a resistance variable memory cell 106) by sensing (e.g., read) a signal, for example, on a bit line 104-0, 104-1, . . . , 104-M associated with the respective cell responsive to a particular voltage applied to the selected word line 102-0, 102-1, . . . , 102-N to which the selected cell is coupled. Sensing the signal associated with the respective cell can include sensing a voltage, a current, an amplitude, and/or a slope (e.g. a time derivative of a parameter of the signal) of the signal, among other characteristics of the signal. In a number of embodiments where a memory cell includes a 3-terminal select device, a word line voltage can be used to select the memory cell and a signal through memory cell can be changed by voltage difference between a bit line and a source of the selected memory cell to vary the resistance level of the memory cell, for example A sensing operation can incorrectly determine the data state of a resistance variable memory cell when the resistance associated with the memory cell during the sensing operation corresponds approximately to a resistance associated with a data state that is different from the data state associated with the programming signal that was used to program the memory cell to an initial state.

A sensing operation according to a number of embodiments of the present disclosure can reduce sensing errors associated with a cell having a resistance associated with two or more data states and/or decrease the time to perform a sensing operation. Previous approaches included sensing operations resulted in sensing errors or reduced sensing errors, but involved a number of time intensive steps that include two sensing operations and a programming operation to determine the data state of the memory cell. In a number of embodiments, a method for sensing a resistance variable memory cell can include applying a programming signal to the memory cell and determining the data state of the memory cell by determining whether the data state of the memory cell changes while applying the programming signal. Changes in the data state of the memory while applying the programming signal can be determined by using a change determination component, e.g., circuitry, to determine if a change in the signal associated with the memory cell occurred while applying the programming signal. For example, determining the data state of the memory cell can include determining that the data state of the memory cell is a data state associated with the programming signal applied to the memory cell when the determined change in the signal associated with the memory cell is less than a threshold amount and determining that the data state of the memory cell is a data state different from the data state associated with the programming signal applied to the memory cell when the determined change in the signal associated with the memory cell is greater than or equal to a threshold amount.

In a number of embodiments, a method for sensing a resistance variable memory cell can include applying a programming signal to the memory cell and determining the data state of the memory cell by detecting changes in resistance of the memory cell while the programming signal is applied to the memory cell using circuitry described herein.

Figure 2:
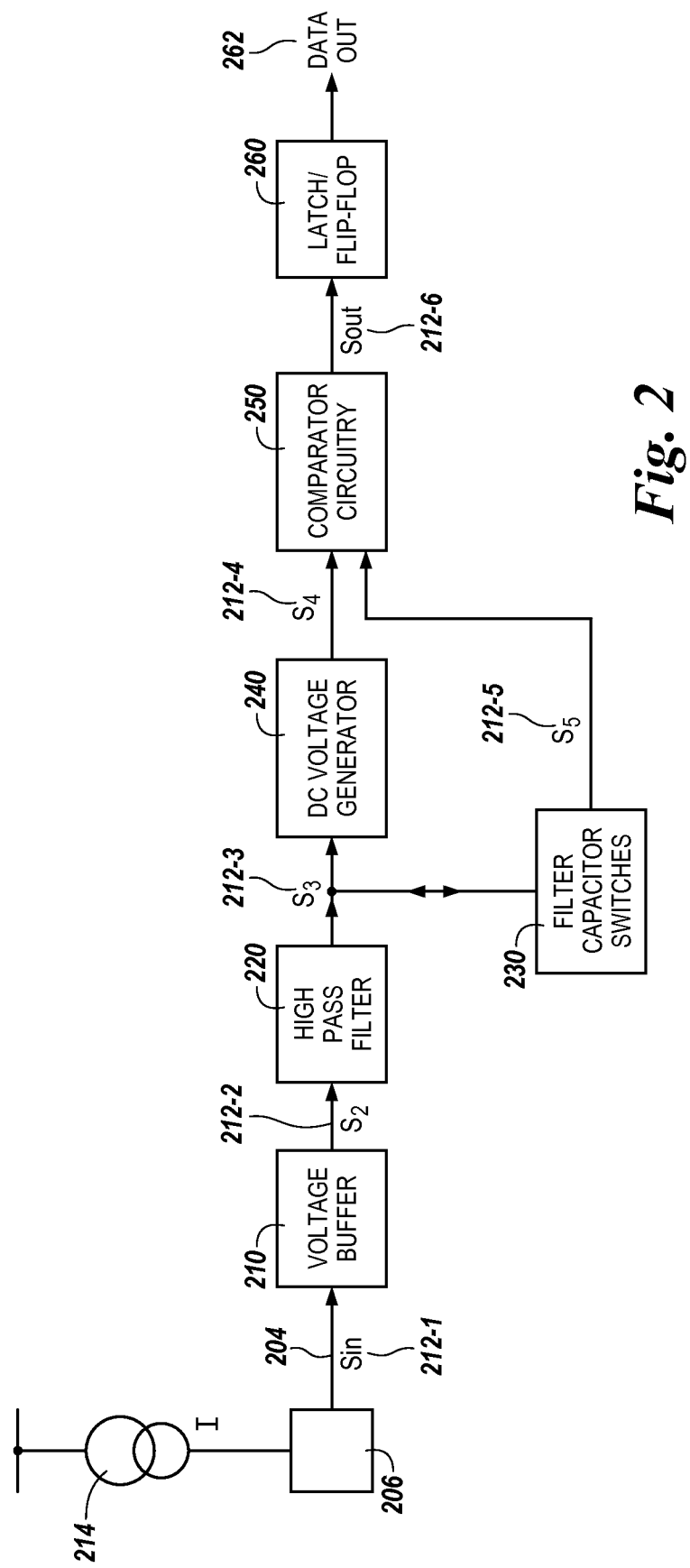
FIG. 2 illustrates a block diagram of components for determining a data state of a resistance variable memory cell according to a number of embodiments of the present disclosure.

FIG. 2 illustrates a block diagram of components for determining a data state of a resistance variable memory cell according to a number of embodiments of the present disclosure. FIG. 2 includes memory cells 206 and the decoding means to select one of the memory cells that receives a programming signal from signal generator 214. The programming signal from signal generator 214 can be a programming signal used to program memory cells to a particular data state. The programming signal can be ramped through a number of currents and/or voltages used to program memory cells to the particular data state. As a result of applying a programming signal to memory cell 206, bit line 204 includes signal ($S_{in}$) 212 associated with memory cell 206. Signal 212 associated with memory cell 206 can be detected using circuitry described in association with FIG. 2 to determine a data state of the memory cell 206 based on changes in resistance of the memory cell 206.

Signal 212 can be input into a voltage buffer 210 and a high pass filter 220. The voltage buffer 210 can drive the high pass filter without loading bit line 204 with additional capacitances. Signal 212-1 can pass through the voltage buffer 210 and the voltage buffer can output signal 212-2 ($S_2$). Signal 212-2 can pass through high pass filter 220 and the high pass filter 220 can output signal 212-3 ($S_3$). Signal 212-3 can be input from the high pass filter 220 into the DC voltage generator 240, which is used to generate a DC signal, signal 212-4 ($S_4$), which is equal to signal 212-3. Signal 212-3 is sampled by circuitry 230 to generate a reference signal, signal 212-5 ($S_5$). The high pass filter 220 is used to superimpose an AC signal to signal 212-3 and signal 212-4 during the programming pulse as result of the change of the resistance from a high resistive state to a low resistive state. Signal 212-4 can be input from the DC voltage generator 240 into comparator circuitry 250 that includes a pre-amplifier, a comparator, and/or other circuitry including some reset logic. For example, DC voltage generator 240 can include an inverter that is closed at its trip point where its input, signal 212-3, is short-circuited to its output, signal 212-4, to generate a DC signal, signal 212-4, that is equal to the input signal 212-3.

Circuitry 230 can include a filter, a capacitor, and a number of switches. In a number of embodiments, the filter, the capacitor, and the number of switches can be used to filter out noise from the signal 212-3 as signal 214 is initially applied to memory cell 206 thus generating signal 212-1. In a number of embodiments, signal 212-3 can be sampled on the capacitor during a first time period via the opening and closing of a number of switches, thus generating the signal 212-5, which is a reference replica to be used by the comparator 250 in a subsequent second time period against the signal 212-4, which is the superimposition of an AC signal to a DC signal. If a change in the state of the resistance of the cells happen during a second period, the corresponding AC signal is large enough to make signal 212-4 to be different from its sampled reference replica 212-5 stored during a first period, thus becoming a large enough detectable input by the comparator 250, that includes a pre-amplifier, a comparator, and/or other circuitry, whose output will change from the reset state to the set state. If no change in the state of the resistance of the cells happens along with the whole programming pulse, the AC signal is small enough or equal to zero thus leaving signal 212-4 to be very close to or equal to the 212-5 sampled at a first time, thus having a small enough input to the comparator to be undetectable and leaving it to its reset state. For instance, the amplitude of the AC voltage signal 212-1 is basically determined by the product Rcell(t)*I, where I is the applied programming current 214 and Rcell is the cell resistance at a given time t; if the Rcell(t) changes from high resistance state to low resistance state Rcell(t+dt), where Rcell(t+dt) is typically close to half of Rcell(t), a voltage drop of about ½*Rcell(t)*I is suddenly happening on top of a stable bit line voltage level, thus generating the AC signal. This AC signal 212-2 is then transferred through the high pass filter 220, which outputs signal 212-3 and then superimposed to the DC signal level of signal 212-4, which stops the stable bit line voltage level.

In a number of embodiments, the comparator circuitry 250 can include a number of inverters to detect resistance changes in memory cell 206. A signal can be output from the number of inverters to circuitry in the comparator circuitry 250. The comparator circuitry 250 can detect changes in the resistance of the memory cell 206 based on the input from the number of inverters and an output from the comparator circuitry 250 can be input into latch and/or flip-flop 260 to determine the data state of the memory cell. The output 262 (Data Out) of latch and/or flip-flop 260 can indicate whether the data state of the memory cell changed due to the application of the programming signal to the memory cell 206. For instance, output 262 can be set to a data state 1 by the comparator from an initial data state 0, where the initial data state 0 was a result of a previously issued reset. As such, if the output 262 indicates the data state changed, the memory cell can be reprogrammed to its initial data state. Embodiments using a number of inverters to detect resistance changes in a memory cell will be described in more detail below in association with FIG. 4.

In a number of embodiments, the comparator circuitry 250 can include circuitry that receives signal 212-4 associated with memory cell 206 and a previously sampled voltage associated with memory cell 206, which is signal 212-5, to detect resistance changes in memory cell 206, which will be described in more detail below in association with FIG. 5. Signal 212 associated with memory cell 206 can be input to a comparator in the comparator circuitry 250, along with a previously sampled voltage associated with the memory cell 206. Those inputs can be used by the comparator to detect changes in resistance of the memory cell 206 and an output from the comparator can be input into latch 260 to determine the data state of the memory cell 206. The output 262 (Data Out) of latch 260 can indicate whether the data state of the memory cell changed due to the programming signal. As such, if the output 262 indicates the data state changed, the memory cell can be reprogrammed to its initial data state.

In a number of embodiments, the comparator circuitry 250 can include circuitry that receives signal 212 associated with memory cell 206 and a reference voltage to detect changes in resistance of the memory cell 206, which will be described in more detail below in association with FIG. 6. A signal associated with a drop in resistance of memory cell 206 and a signal associated with the reference signal can be input to a comparator in the comparator circuitry 250. Those inputs can be used by the comparator to detect changes in the resistance of the memory cell 206 and an output from the comparator can be input into latch 260 to determine the data state of the memory cell 206. The output 262 (Data Out) of latch 260 can indicate whether the data state of the memory cell changed due to the programming signal. As such, if the output 262 indicates the data state changed, the memory cell can be reprogrammed to its initial data state.

In an example in which the memory cell is an STT memory cell, the particular programming signal can be a programming signal used to program the memory cell to a parallel state. An occurrence of a change in the resistance of the memory cell may be detected if the initial data state of the memory cell is an anti-parallel data state and the particular programming signal is a programming signal used to program memory cells to a parallel state; therefore, detecting that a change in the resistance of the memory cell occurred would indicate that the memory cell is not at the particular data state (e.g., parallel data state), but at a different data state (e.g. anti-parallel data state). A detected change in resistance of the memory cell can indicate a data state change for the memory cell during the application of the programming signal, therefore the memory cell can be programmed back to its initial state. For example, a programming signal associated with programming memory cells to the anti-parallel data state can be applied to the memory cell to return the memory cell to the initial data state.

For example, during implementation of the embodiments illustrated in FIG. 2, the particular programming signal can be incrementally ramped through a number of programming signal values that are used to program memory cells to the particular data state. The particular programming signal can be incrementally ramped until a determination that a change in the current and/or voltage associated with the memory cell occurred, a maximum programming signal value is reached, or a maximum time period for applying the particular programming signal is reached.

Figure 3:
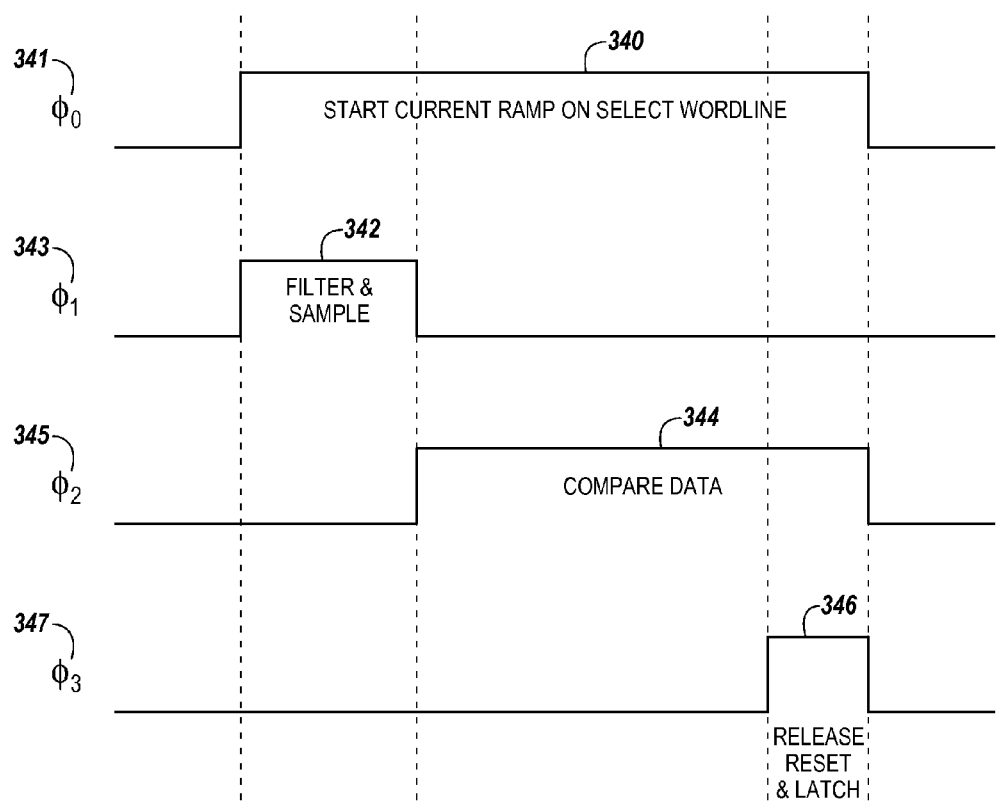
FIG. 3 illustrates a chart indicating the phases in determining a data state of a resistance variable memory cell according to a number of embodiments of the present disclosure.

FIG. 3 illustrates a chart indicating the phases in determining a data state of a resistance variable memory cell according to a number of embodiments of the present disclosure. In FIG. 3, a first phase ($\phi_0$) 341 includes applying a programming signal on a memory cell by starting a current ramp. The programming signal can be incrementally ramped through a number of programming signal values that are used to program memory cells to a particular data state. The programming signal can be applied for a time period 340 during the first phase 341. The particular programming signal can be incrementally ramped until a determination that a change in the current associated with the memory cell occurred, a maximum programming signal value is reached, or a maximum time period for applying the particular programming signal is reached, e.g., time period 340.

In FIG. 3, a second phase ($\phi_1$) 343 includes filtering and sampling a signal associated with a memory cell. The signal can be filter and sampled using circuitry, e.g., circuitry 230 in FIG. 2. The signal can be filtered and sampled during a time period 342. Time period 342 can be during a first portion of time period 340.

In FIG. 3, a third phase ($\phi_2$) 345 includes comparing signals to determine the data state of a memory cell. Comparing signals to determine the data state of the memory cell can be completed by using circuitry, e.g., comparator circuitry 250, 450, 550, and/or 660 in FIGS. 2, 4, 5 and/or 6. Signals can be compared during a time period 344. Time period 344 can be during a second portion of time period 340 and after time period 342.

In FIG. 3, a fourth phase ($\phi_3$) 347 includes resetting the comparator and latching the data state to a latch. Resetting the comparator and latching the data state to a latch can be completed during a time period 346. Time period 346 can be during a third portion of time period 340 and during the end of time period 344.

Figure 4:
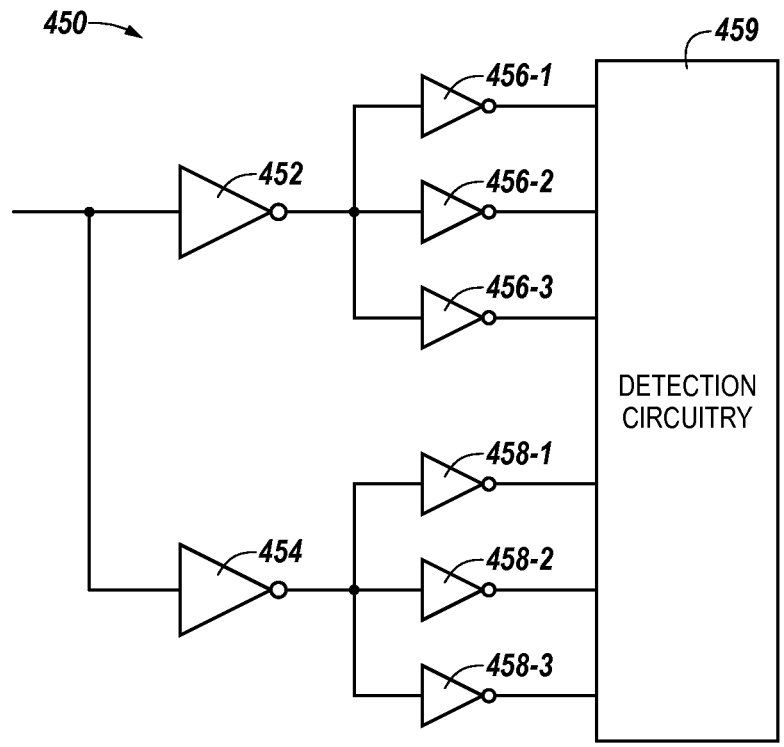
FIG. 4 illustrates circuitry for determining a data state of a resistance variable memory cell according to a number of embodiments of the present disclosure.

FIG. 4 illustrates circuitry 450 for determining a data state of a resistance variable memory cell according to a number of embodiments of the present disclosure. FIG. 4 includes inverters 452, 454, 456-1, 456-2, 456-3, 458-1, 458-2, and 458-3, which can be part of comparator circuitry, e.g., comparator circuitry 250 in FIG. 2, used to determine the data state of resistance variable memory cells. The circuitry 450 can receive a signal associated with a memory cell from a DC voltage generator, e.g. DC voltage generator 240 in FIG. 2. The signal associated with a memory cell can be passed through inverters 452 and 454. Inverters 452 and 454 can be configured the same so they both pass the same signal, therefore inverters 456-1, 456-2, and 456-3, receiving a signal from inverter 452, and inverters 458-1, 458-2, and 458-3, receiving a signal from inverter 454, all receive the same "matched" signal.

Inverters 456-1, 456-2, and 456-3 can be configured to pass a signal when receiving a signal associated with the memory cell having a voltage that corresponds to the memory cell at a data state that is different from the particular data state associated with the programming signal applied to the memory cell. Inverters 456-1, 456-2, and 456-3 can be configured to pass signals each with different voltages that correspond to a trip point of the data state that is different than the data state associated with the programming signal, but where each of the voltages are within a range of voltages that are associated with the memory cell having a resistance corresponding to a data state that is different from the particular data state associated with the programming signal that is applied to the memory cell. Therefore, a majority voting scheme can be used by inverters 456-1, 456-2, and 456-3, where if detection circuitry 459 receives a signal from 2 of the 3 inverters 456-1, 456-2, and 456-3, the circuitry detects a change in resistance of the memory cell and can send an output to a latch, indicating that the resistance of the memory cell corresponds to a data state that is different from the particular data state associated with the programming signal that is applied to the memory cell. An output from the latch can indicate that the data state of the memory cell changed due to the programming signal.

Inverters 458-1, 458-2, and 458-3 can be configured to pass a signal when receiving a signal associated with the memory cell having a voltage that corresponds to the memory cell at a data state associated with the programming signal that is applied to the memory cell. Inverters 458-1, 458-2, and 458-3 can each be configured to pass signals with different voltages that correspond to a trip point of the data state associated with the programming signal, but where each of the voltages are within a range of voltages that are associated with the memory cell having a resistance corresponding to a data state associated with the programming signal that is applied to the memory cell. Therefore, a majority voting scheme can be used by inverters 458-1, 458-2, and 458-3, where if the detection circuitry 459 receives a signal from 2 of the 3 inverters 458-1, 458-2, and 458-3, the circuitry does not detect a change in resistance of the memory cell and can send an output to a latch, indicating that the resistance of the memory cell corresponds to a data state that is different from the particular data state associated with the programming signal that is applied to the memory cell. An output from the latch can indicate that the data state of the memory cell did not change due to the programming signal. Although the embodiments illustrated in FIG. 4 include sets of 3 inverters, embodiments of the present disclosure are not so limited and may include any number of inverters.

Figure 5:
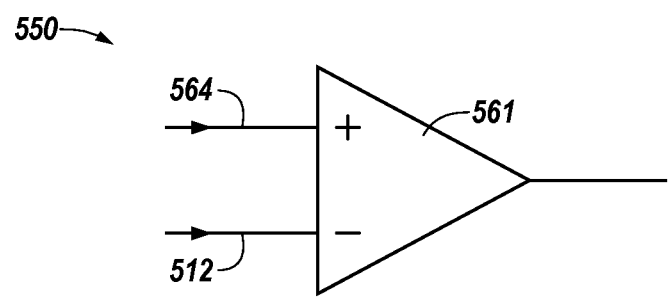
FIG. 5 illustrates circuitry for determining a data state of a resistance variable memory cell according to a number of embodiments of the present disclosure.

FIG. 5 illustrates circuitry 550 for determining a data state of a resistance variable memory cell according to a number of embodiments of the present disclosure. FIG. 5 includes comparator 561, which can be part of comparator circuitry, e.g., comparator circuitry 250 in FIG. 2, that is used to determine the data state of resistance variable memory cells. The comparator 561 can receive a signal 512 associated with a memory cell from a DC voltage generator, e.g. DC voltage generator 240 in FIG. 2. The comparator 561 can also receive a signal 564, where signal 564 is a previously sampled signal that was sampled when the programming signal is initially applied to the memory cell, e.g. during time period 342 in FIG. 3. Signal 564 can be stored on a capacitor input into comparator 559 by using opening and closing a number of switches, e.g., circuitry 230 in FIG. 2.

In a number of embodiments, if the signals 512 and 564 and received by comparator 561 have different voltages, comparator 561 can send an output to a latch indicating that the resistance of the memory cell corresponds to a data state that is different from the particular data state associated with the programming signal that is applied to the memory cell. An output from the latch can indicate that the data state of the memory cell changed due to the programming signal.

In a number of embodiments, if the signals 512 and 564 received by comparator 561 have the same voltage, e.g., the signal 512 and 564 have the same magnitude, comparator 561 can send an output to a latch, indicating that the resistance of the memory cell corresponds to a data state that is associated with the programming signal that is applied to the memory cell. An output from the latch can indicate that the data state of the memory cell did not change due to the programming signal.

Figure 6:
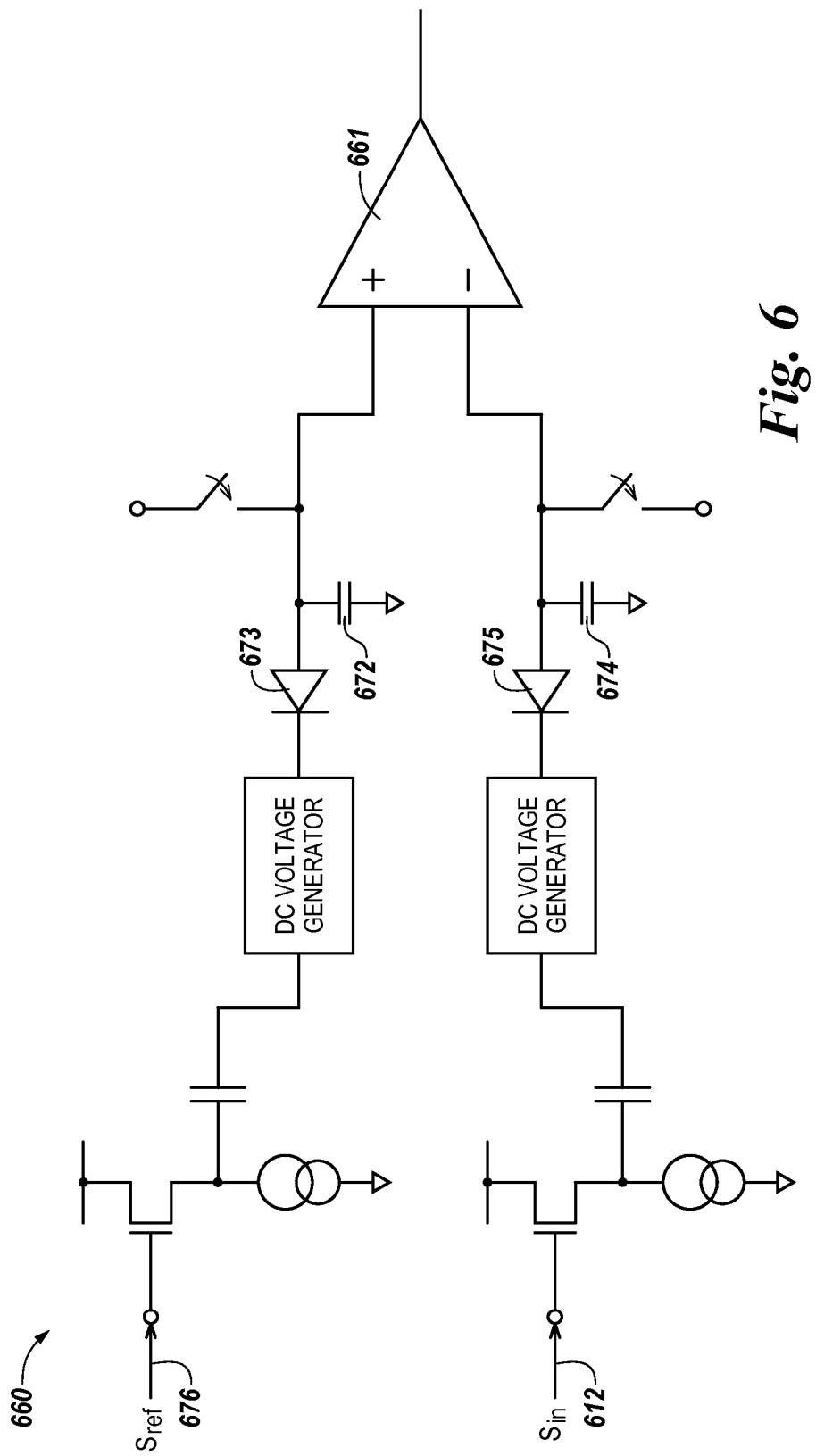
FIG. 6 illustrates circuitry for determining a data state of a resistance variable memory cell according to a number of embodiments of the present disclosure.

FIG. 6 illustrates circuitry 660 for determining a data state of a resistance variable memory cell according to a number of embodiments of the present disclosure. The circuitry in FIG. 6 is a different implementation of the circuitry described in association with elements 210, 220, 230, 240, and 250 in FIG. 2. Circuitry 660 can include diodes 673 and 675 and capacitors 672 and 674 that are precharged with signals having the same voltage. Signal ($S_{in}$) 612 associated with the memory cell and signal ($S_{ref}$) 676, which is a reference signal having a voltage that increases as the current of the programming signal increases, can be applied to circuitry 660.

The circuitry 660 can be configured so that as signal 676 is applied to the circuitry 660, capacitor 672 does not discharge and an input into comparator 661 is associated with the signal 676. The circuitry 660 can be configured so that as signal 612 associated with a memory cell is applied to the circuitry 660, the voltage of signal 612 will increase as the current of the programming signal applied to the memory cell increases so that capacitor 674 does not discharge and an input into comparator 661 is associated with the signal 612 and matches the input associated with signal 676. While the programming signal is applied the memory cell, a drop in resistance of the memory cell can cause a drop in the voltage of signal 612 being applied to circuitry 660 and circuitry 660 can be configured so that the drop in voltage of signal 612 will cause capacitor 674 to discharge. Therefore, when the resistance of the memory cell drops while the programming signal is applied to the memory cell, a signal can be input into comparator 661 that is associated with the capacitor 674. When the comparator 661 receives inputs that are associated with signal 676 and 612 and match each other, the comparator 661 can output a signal to a latch that indicates the resistance of the memory cell has not changed and the latch can output a signal that indicates the data state of the memory cell did not change due to the programming signal. When the comparator 661 receives inputs that are associated with signal 676 and with capacitor 674 that are different from each other, the comparator 661 can output a signal to a latch that indicates the resistance of the memory cell has changed and the latch can output a signal that indicates the data state of the memory cell changed due to the programming signal.

Figure 7:
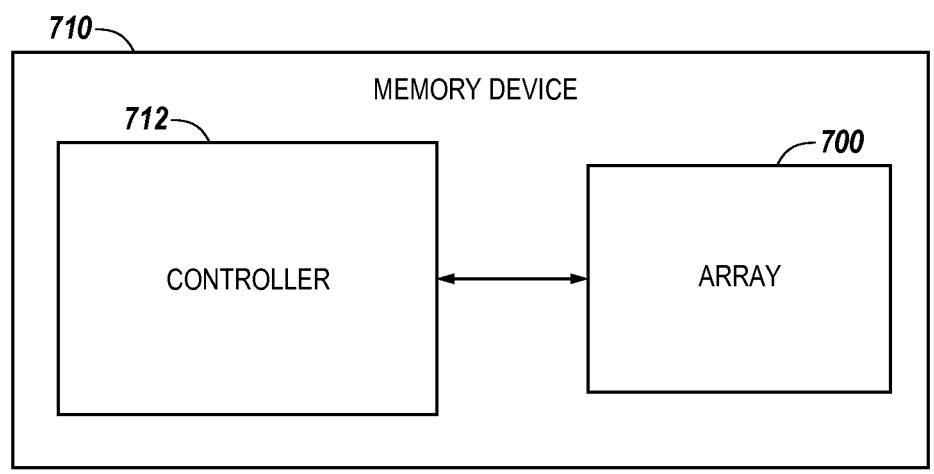
FIG. 7 illustrates a block diagram of an apparatus in the form of a memory device according to a number of embodiments of the present disclosure.

FIG. 7 illustrates a block diagram of an apparatus in the form of a memory device 710 according to a number of embodiments of the present disclosure. As shown in FIG. 7, memory device 710 includes a controller 712 coupled to a memory array 700. As used herein, a memory system, a controller, or a memory device might also be separately considered an "apparatus." An "apparatus" can refer to, but is not limited to, any of a variety of structures or combinations of structures, such as a circuit or circuitry, a die or dice, a module or modules, a device or devices, or a system or systems, for example.

Memory array 700 can be analogous to, for example, memory array 100 previously described in connection with FIG. 1. Although one memory array is shown in FIG. 7, embodiments of the present disclosure are not so limited (e.g., memory device 710 can include more than one memory array coupled to controller 712).

Controller 712 can include, for example, control circuitry and/or firmware. Controller 712 can be included on the same physical device (e.g., the same die) as memory array 700, or can be included on a separate physical device that is communicatively coupled to the physical device that includes memory array 700. For example, controller 712 can be a controller of an array testing apparatus (e.g., a controller used to perform testing operations on memory arrays such as array 700).

In this example, controller 712 includes control circuitry and/or firmware to detect changes in resistance of memory cells in array 700. The control circuitry and/or firmware can be included on the same physical device (e.g., the same die) as memory array 700, or can be included on a separate physical device that is communicatively coupled to the physical device that includes memory array 700. The control circuitry and/or firmware can be the circuitry illustrated in and described in association with FIGS. 2-6.

Controller 712 can apply a number of signals in accordance with a number of embodiments of the present disclosure to the memory cells (e.g., to the storage elements of the memory cells) in memory array 700. For example, controller 712 can apply a programming signal previously described in connection with FIG. 1 to the storage element of the memory cells in memory array 700.

The embodiment illustrated in FIG. 7 can include additional circuitry that is not illustrated so as not to obscure embodiments of the present disclosure. For example, memory device 710 can include address circuitry to latch address signals provided over I/O connectors through I/O circuitry. Address signals can be received and decoded by a row decoder and a column decoder, to access memory array 700. As an additional example, memory device 710 can include sense (e.g., read) circuitry.

CONCLUSION

The present disclosure includes apparatuses and methods for sensing a resistance variable memory cell. A number of embodiments include circuitry to apply a programming signal to a memory cell in the array, the programming signal associated with programming resistance variable memory cells to a particular data state, and detect a change in resistance of the memory cell to determine if a data state of the memory cell changes from an initial data state to a different data state during application of the programming signal.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of resistance variable memory cells; and
circuitry configured to:
    apply a programming signal to a memory cell in the array continuously for a particular time period, wherein the memory cell had previously been programmed to one of a number of data states and the programming signal is a signal that is also used to program resistance variable memory cells to a particular data state of the number of data states; and
    determine a data state of the memory cell by comparing a first signal associated with an electrical characteristic of the memory cell generated during the particular time period while applying the programming signal to the memory cell and a second signal associated with the electrical characteristic of the memory cell generated during the particular time period while applying the programming signal to the memory cell, wherein the data state of the memory cell is the particular data state when the first signal is equal to the second signal and the data state of the memory cell is different than the particular data state when the first signal is different than the second signal.

2. The apparatus of claim 1, wherein the circuitry configured to determine the data state of the memory cell includes a comparator to compare the first signal currently associated with the memory cell to the second signal previously associated with the memory cell.

3. The apparatus of claim 2, wherein the second signal corresponds to a voltage of the memory cell as the programming signal is initially applied to the memory cell.

4. An apparatus, comprising:
an array of resistance variable memory cells; and
circuitry configured to:
    apply a programming signal to a memory cell in the array continuously for a particular time period, wherein the memory cell had previously been programmed to one of a number of data states and the programming signal is a signal that is also used to program resistance variable memory cells to a particular data state of the number of data states; and determine a data state of a memory cell in the array by comparing a first signal associated with an electrical characteristic of the memory cell generated during a first time period of the particular time period while the programming signal is applied to the memory cell and a second signal associated with the electrical characteristic of the memory cell that is generated and stored in a capacitor during a second time period of the particular time period while the programming signal is applied to the memory cell, wherein the second time period is prior to the first time period and wherein the data state of the memory cell is the particular data state when the first signal is equal to the second signal and the data state of the memory cell is different than the particular data state when the first signal is different than the second signal.

5. The apparatus of claim 4, wherein the second signal is a signal associated with the memory cell when the memory cell is at the one of a number of data states to which the memory cell had been previously programmed.

6. The apparatus of claim 5, wherein the first signal is a signal associated with the memory cell when a resistance of the memory cell remains the same in response to the programming signal being applied to the memory cell.

7. The apparatus of claim 4, wherein the circuitry outputs the data state of the memory cell based on the signal passed from a comparator to a latch.

8. An apparatus, comprising:
an array of resistance variable memory cells; and
circuitry including a comparator that detects changes in resistance of a memory cell by comparing a first signal currently associated with an electrical characteristic of the memory cell that is generated while a programming signal is applied to the memory cell continuously for a particular time period to a second signal previously associated with the electrical characteristic of the memory cell that was generated while the programming signal was initially applied to the memory cell during the particular time period to determine a data state of the memory cell, wherein the memory cell had previously been programmed to one of a number of data states and the programming signal is a signal that is also used to program the memory cell to a particular data state of the number of data states and wherein the data state of the memory cell is the particular data state when the first signal is equal to the second signal and the data state of the memory cell is different than the particular data state when the first signal is different than the second signal.

9. The apparatus of claim 8, wherein the second signal is sampled during a first time period.

10. The apparatus of claim 9, wherein the second signal and the first signal currently associated with the memory cell are input into a comparator during a second time period that is after the first time period.

11. The apparatus of claim 8, wherein the circuitry indicates the data state of the memory cell is the data state associated with the programming signal when the second signal previously associated with the memory cell and the first signal associated with the memory cell have a same magnitude.

12. The apparatus of claim 8, wherein the circuitry indicates the data state of the memory cell is a data state that is different from the data state associated with the programming signal when the second signal previously associated with the memory cell and the first signal associated with the memory cell are different.

13. The apparatus of claim 8, wherein the circuitry is configured to apply the programming signal by ramping the programming signal through a range of currents associated with programming memory cells to the particular data state.

* * * * *